(12) United States Patent
Harcourt

(10) Patent No.: US 7,032,728 B2
(45) Date of Patent: Apr. 25, 2006

(54) RETRACTABLE CABLE ASSEMBLIES AND DEVICES INCLUDING THE SAME

(75) Inventor: Jefferson Harcourt, South Melbourne (AU)

(73) Assignee: Taylor PTY LTD, Elsternwick (AU)

( * ) Notice: Subject to any disclaimer, the term of this patent is extended or adjusted under 35 U.S.C. 154(b) by 0 days.

(21) Appl. No.: 10/816,852

(22) Filed: Apr. 5, 2004

(65) Prior Publication Data
US 2004/0256188 A1 Dec. 23, 2004

Related U.S. Application Data

(63) Continuation of application No. PCT/AU02/01347, filed on Oct. 4, 2002.

(30) Foreign Application Priority Data
Oct. 5, 2001 (AU) .................................. PR8111

(51) Int. Cl.
*H02G 11/00* (2006.01)
(52) U.S. Cl. ................. 191/12.2 R; 191/12.4
(58) Field of Classification Search .......... 191/12 R, 191/12.2 R, 12.4, 12.2 A; 174/135, 50; 242/378.4, 242/378, 378.1; 439/501
See application file for complete search history.

(56) References Cited

U.S. PATENT DOCUMENTS 5,590,749 A * 1/1997 Wagner et al. ............. 191/12.4
6,390,261 B1 * 5/2002 Liao ....................... 191/12.2 R

FOREIGN PATENT DOCUMENTS

| EP | 0 836 309 A1 | 4/1998 |
| EP | 1 075 127 A1 | 2/2001 |
| GB | 2 290 777 A | 1/1996 |
| GB | 2 362 633 A | 11/2001 |
| WO | WO 00/31847 * | 6/2000 |
| WO | WO 00/45490 A2 | 8/2000 |
| WO | WO 01/06739 A1 | 1/2001 |
| WO | WO 01/48883 A2 | 4/2001 |
| WO | WO 01/65812 A1 | 9/2001 |
| WO | WO 01/74015 A1 | 10/2001 |

* cited by examiner

*Primary Examiner*—Mark T. Le
(74) *Attorney, Agent, or Firm*—Oliff & Berridge, PLC

(57) ABSTRACT

In a retractable case assembly, e.g. for an earphone, a flexible circuit board (FCB) element, preferably having a coiled portion, is used to provide a fixed, good quality, electrical connection between a retractable cable and circuitry that may be mounted on a land portion of the FCB. The circuitry may include a socket for connection to the input/output of a device with which the earphone is to be used, e.g. a mobile phone, portable computing device or personal sound system. The cable may be wound about a take-up reel, and the FCB coil may be wound in the opporite direction within the reel, so that as the cable is extended or retracted, the FCB coil expands or contracts. The reel may be biased to retract the cable by a spring. A microswitch may signal when the cable is extended.

33 Claims, 5 Drawing Sheets

RETRACTABLE CABLE ASSEMBLIES AND DEVICES INCLUDING THE SAME

This is a Continuation of Application No. PCT/AU02/01347 filed Oct. 4, 2002. The entire disclosure of the prior application is hereby incorporated by reference herein in its entirety.

The present invention relates to retractable cable assemblies and to devices including such cables. It relates particularly, though not exclusively, to headsets and the like for personal electronic devices, such as for personal stereos, mobile telephones and portable computing devices.

Many electronic devices, such as mobile telephones and personal stereo systems, include headsets, such as earpieces, in order to allow a user to listen to the device in a hands-free and private manner.

These headsets generally include a length of cable for connection to the device, but rarely include any management of the cable. Accordingly, when the cable is unused, it must be wound around the device or otherwise manually wound and stored. This is inconvenient, and can damage the cable.

A retractable cable arrangement is known in which the cable is wound about a spring-biased reel. The cable can be pulled off of the reel to extend the cable for use, and, when released, is automatically wound back onto the reel under the spring bias.

In this arrangement, the electrical connection between the wires of the cable and the output circuitry of the device is provided by a set of concentric circular tracks that are mounted opposite a face of the cable reel. These circular tracks connect with the output circuitry of the device, and the ends of the cable wires contact these tracks through brush elements. Thus, as the reel is wound, the brushes move about the circular tracks and maintain electrical connection to the device.

Such an arrangement is not ideal, as the track and brush connections can be complex and are often not particularly reliable. They can also produce poor contact, resulting in poor sound quality.

The present invention has been devised with a view to addressing such problems.

Viewed from a first aspect, the present invention provides a retractable cable assembly, in which the cable is connected to a flexible circuit board element. It can also be seen as providing a retractable cable assembly, in which the cable is connected to associated circuitry through a flexible circuit board element.

The use of a flexible circuit board (FCB) element (also known as a flexible PCB, Flex PCB, or a FPC), which may be in the form of a length of FCB, is able to provide a simple yet effective connection between the retractable cable and associated circuitry and the like. For example, it could provide a connection between an earphone or other transducer on the cable and connection circuitry for connecting the earphone/transducer to an input and/or output socket of a device, such as a personal stereo, mobile telephone or the like, or it could provide a connection from the earphone/transducer directly to the input and/or output circuitry of a device.

Further, the flexible nature of the FCB element allows the connection between the circuitry and cable to be fixed, without need for brushes or the like, and so the quality of the connection can be high. This means that e.g. high quality sound can be provided. The use of circular tracks and brushes, as in the prior art, introduces contact or wiping noise into the signal carried by the cable, and this noise becomes more prevalent over time as the contacts age and wear. The present invention is able to overcome this problem by removing the need for such tracks. It is able to provide a fixed connection that is able to flex to accommodate movement of the cable's connection end, as the cable is retracted or extended.

The FCB element may take any suitable form, and will generally have one or more electrical tracks provided thereon for connection with one or more wires of the retractable cable. It is preferably provided as a coiled strip of FCB, one end of which may be electrically connected with the retractable cable. This allows the coil of FCB to wind and unwind as the cable is used.

The FCB element may be connected to associated circuitry in any suitable manner. In one preferred form, the FCB element includes both a length of FCB and a land portion of FCB from which the length portion extends. The land portion can then provide a means for connecting with suitable circuitry.

The land portion may be provided with suitable connection circuitry, and may have various components mounted thereon including for example input circuitry, output circuitry, a connector socket, amplifier circuitry, volume control circuitry, and the like. This provides an advantageous arrangement, with mechanically strong electrical connections.

In an especially preferred form, the assembly includes a take-up reel about which the retractable cable is stored. Preferably, the FCB element is mounted by the reel, e.g. within the reel, preferably in a cooed manner. In this arrangement, as the take-up reel rotates during the winding up or taking out of the cable, the coil may expand or contact to reduce stain on the connection between the FCB element and the cable and/or on the transition region between the strip and land portions of the FCB element.

The FCB coil may be wound within the take-up reel in an opposite direction to the winding of the cable about the reel, so that when the cable is wound up, the coil is in a contracted condition, and when the cable is extended, the coil is in an expanded condition. It would, however, be possible to have the coil and cable wound in the same direction.

The retractable cable may take any suitable form, and may comprise any suitable standard cable on the market today. In a preferred form, the cable is of a flat configuration. The cable wires may be arranged parallel to one another, and may themselves also be of a flat form. Such arrangements provide for a particularly compact assembly, in which the space needed to accommodate the wound cable is kept low. The cables may for example comprise plastic insulated copper multi-core conductors.

In one possible form, the cable may be an extension of the FCB element itself, and, viewed from a further aspect, the present invention provides a retractable cable assembly in which the cable is provided at least in part by a FCB element.

The FCB element may be made of any suitable materials, and e.g. may comprise a polyamide substrate, (e.g. copper) conductive elements, and an insulative coverlay. This and other structures, such as using polyimide or polyester substrates, are well-known in the art. The FCB element may be single-sided, double-sided or multilayered, and may include stiffeners and the like as necessary, e.g. on the land portion.

The electrical connection between the FCB and cable may take any suitable form. In one embodiment, the FCB element and cable are connected to one another directly, e.g. by soldering the cable conductors to the FCB element.

In another form, the FCB element and cable are attached via intermediate means. For example, in the take-up reel arrangement, the cable connection end of the FCB coil and the coil connection end of the cable could connect to the take-up reel, and connection means could then be provided in or on the take-up reel to connect wires from the cable with appropriate tracks of the FCB element. These connection means could take the form of e.g. electrical tracks and/or plated through-holes on the reel, and/or mating connectors, e.g. subminiature connectors, or the like on the FCB and cable ends.

The reel end of the retractable cable is preferably anchored, e.g. to the real, at some point so as to reduce strain on the FCB cable connection, e.g. when the cable is fully extended from the assembly. This may be achieved, e.g. by a suitable clamping means. In one preferred form, anchoring, e.g. clamping to the reel, occurs at the connection between the cable and FCB element. This helps to strengthen the connection whilst providing strain relief and also holding the cable end of the FCB element in a fixed position on the take-up reel.

The cable may be retracted into the assembly in any suitable manner, which may be automatic or manual. For example, the take-up reel may include means for it to be manually turned to wind in the cable, or may include automatic means for doing this.

In one embodiment, the reel may be motorised, e.g. using a small electric motor/micromotor. In this embodiment, the motor may be activated by a user pressing a retraction switch. Alternatively or also, the motor may be voice activated. This may be achieved using a microphone of the assembly itself, or may be achieved by using a microphone of the device with which the assembly is associated (e.g. that it is attached to or built into). For example, where the assembly is mounted on or built within a mobile telephone, a voice command into the microphone of the mobile phone may be used to activate a reel motor to retract the cable. Activation may be through e.g. a signal sent to an output socket of a device to which a stand-alone cable assembly may connect, or through a signal to an internal motor control of the device.

Further, a signal indicating any other suitable action or a status of an associated device may be used to activate the sable retraction. Such an action could be e.g. the powering down of the device, or the switching to a stand-by mode or to another mode in which an extended cable is not required. The assembly may thus include a motor control for receiving a retraction signal and/or for monitoring the status of and/or actions carried out by/on an associated device.

In one preferred embodiment, the reel is spring-biased to wind-up the cable. This spring bias may be achieved in any suitable manner, and e.g. could be through the use of a coded spring, which may for example be mounted parallel to or within the take-up reel.

The assembly may include latch means, so that when the cable is extended, is it not rewound until the latch mechanism is released, e.g. through the activation of a latch release button on the side of the assembly. The latch means may comprise a catch that engages with the cable reel by friction and/or in a ratchet fashion, e.g. engaging with the take-up reel around its periphery or using other appropriate means.

The cable assembly may include a sensor/trigger means, e.g. a microswitch, photocell or any other suitable means, which may be activated when the cable is unwound and/or retracted so as to provide a signal of this and to allow any suitable corresponding action to occur. For example, in the case of a mobile telephone or portable computing device, the extension of the cable could switch the sound output of the telephone or computer from a standard speaker of the telephone or computer to an earpiece output.

The trigger means may be mounted on a land portion of the FCB element. It may for example be triggered by the presence or absence of a component at the free end of the cable at the components stored position, e.g. through contact of the trigger means with a stem portion of an earpiece when the earpiece is retracted. A signal from the sensor/trigger means may then be used by the electronics of the circuitry and/or passed to electronics of an associated device in order to effect a suitable response.

The retractable cable assembly may be integral with an electronic or other device, e.g. included in the device on manufacture thereof, or may be provided as a stand-alone unit. In the latter case, the assembly may include suitable connection means for physically connecting the assembly to a device, and/or may include suitable electrical connection means for electrically connecting to output circuitry/connection means of the device, e.g. for connecting to a jack socket, serial or parallel port or the like.

The assembly may provide e.g. a headset or other component, e.g. a transducer component, at the free end of the retractable cable. Alternatively, the assembly may provide a connection/socket element at the free end of the retractable cable, and e.g. a headset or other component at the assembly housing. In either case, the headpiece or other component will be able to connect with an associated device through a retractable cable.

The assembly may include two or more cables, e.g. a pair of retractable cables, e.g. parallel to one another so as to provide e.g. twice the extension capabilities and/or a choice of whether to extend a cable ending in a socket and/or a cable ending in a component. The extra cable or cables may be attached to the same or separate FCB elements.

The cable may be used in any suitable application, and the assembly may be used to provide a retractable cable for any suitable device/component that needs to extend from a base unit or from any other structure. The assembly could thus be used with an earpiece, a microphone, or a combined earpiece and microphone, e.g. a telephone headset. It could also be used in a stereo system having extensible speakers.

Other uses would include personal sound systems, such as CD players, MP3 players, minidiscs, tape recorders, radios, dictaphones or the like, and the assembly could be used in many fields, such as the fields of personal and portable sound, home and studio sound, architectural power, automotive products, domestic appliances, aviation, and personal and business electronic devises. Thus, for example, car, motorcycle or aeroplane communications and/or entertainment systems could include the assembly, e.g. in a car or aeroplane seat.

Indeed, the invention may be used in any application where a cable or cables require coring for deployment or stowage, and need not be used to transmit sound signals, but could be used in any suitable application, e.g. for power supply or for computer data transfer or for use with a games console, e.g. to connect a control device, such as a mouse, gaming paddle or joystick or the like.

It could further for example be used with an antenna, and the retractable cable could itself comprise an antenna, so that there is no device/component at e.g. the free end of the cable. In this case, it is the cable itself that requires the extension.

The FCB element may be made in any suitable manner. For example, the coiled portion of the FCB could be formed from the coiling of a straight cut length of FCB material. In one preferred embodiment, however, a spiral strip of FCB is cut from a flat sheet of FCB, and the strip is then wound into a coil. Preferably, one end of the strip includes a land portion on which electronic componentry can be mounted, and the spiral portion of the FCB element is wound about an axis angled, e.g. perpendicular, to the plane of the land portion of the FCB element.

Preferably, the FCB element is formed from a flat sheet of FCB material in which a strip of FCB material spirals about a central land portion.

The present invention extends to an electronic or other device including a retractable cable assembly in accordance with any of the above-discussed features. As said above, this device could be e.g. a mobile phone, portable computing device or other personal electronic device, etc.

The present invention further extends to a FCB element having a coiled portion and a land portion, with the coiled portion preferably coiling about an axis inclined to the plane of the land portion, preferably perpendicular.

The present invention also extends to a method of making a FCB element including the steps of cutting a spiral length of material from a sheet of FCB and coiling the spiral length. Preferably, the FCB includes a land portion, and the spiral portion is provided about the land portion. The invention also extends to a method of making a retractable cable assembly or device including such an assembly, including the step of making the flexible circuit board element in accordance with the above-mentioned method.

The present invention also extends to a retractable cable assembly in which the cable is an extension of a flexible circuit board element.

It further extends to a cable management assembly including a flexible circuit board element that connects an extendible cable with associated electronic componentry.

Still further, the present invention extends to a cable management assembly including a retractable cable mounted on a take-up reel, and a coiled flexible circuit board element mounted within the take-up reel and electrically connected to the retractable cable so as to allow the cable to connect with associated electronic circuitry whilst also accommodating movement of the reel end of the cable when the cable is retracted or extended.

The arrangement of a take-up reel having a retractable cable wound about it, and an electrical connection coiled within it, is in itself of significance, and, although a FCB coil provides a particularly advantageous construction that is small, compact and rugged, it could be replaced with any connection element that can be put into a coiled configuration. Indeed, the connection element could also provide a spring bias action to retract the cable.

Thus, the present invention further extends to a retractable cable assembly, the assembly including a reel element which has a retractable cable mounted about its outside and a coiled connection element mounted within the reel element and connected with the cable. It can also be seen as providing a retractable cable assembly the assembly including a reel element that has a retractable cable mounted about its outside and a coiled connection element mounted within it, the coiled connection element connecting the retractable cable with associated circuitry.

In one form of this aspect, the connection means within the reel may be a part of the retractable cable, the cable being anchored, e.g. clamped, at or adjacent to the point where the cable enters the reel, so as to separate the cable into two portions. The cable portion within the reel is preferably wound in the opposite direction to the cable portion outside of the reel.

The motor-control and/or automatic activation of the assembly are also in themselves inventive features, and viewed from a further aspect, the present invention also provides a retractable cable assembly including a retractable cable, a take-up reel for mounting the cable, a motor mechanism for rotating the reel, and motor control circuitry for activating the motor to withdraw the cable on receipt of an activation signal. Preferably, the assembly also includes a control for determining when a predetermined action occurs in a device with which the assembly is associated and for issuing the activation signal. The predetermined action may be for example one or more of a voice command, a power-down of the device, a change in status of the device to a status in which the cable is not required, or the activation of a switch of the device to indicate that retraction of the cable is desired.

The various above-mentioned aspects of the present invention may include any of the other above-mentioned features and alternatives, and cover assemblies when in the form of stand alone units and/or when integrated into a device.

Embodiments of the present invention will now be described, by way of example only, with reference to the accompanying drawings. It is to be understood that the particularity of the drawings does not supersede the generality of the preceding description of the invention.

Figure 1:
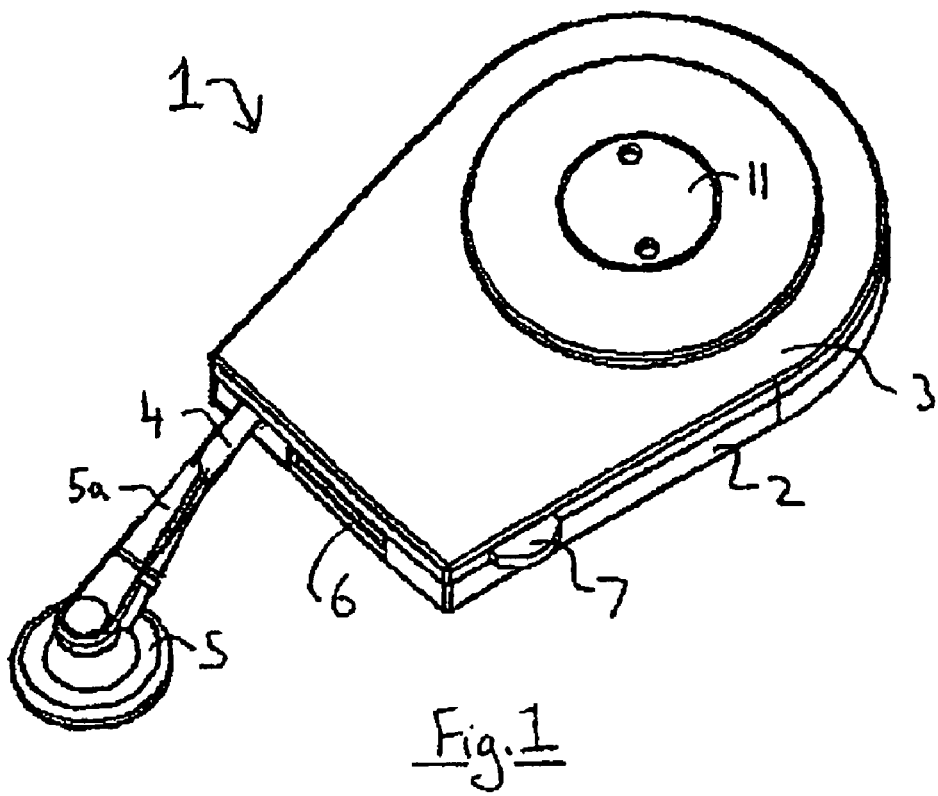
FIG. 1 is a top perspective view of a retractable earphone device in accordance with one embodiment of the present invention.

Referring to FIG. 1, a retractable cable assembly 1 comprises a housing 2 having a cover 3 thereon, within which is mounted a retractable flat cable 4 having an earpiece 5 mounted at its free end. The assembly 1 also includes a connection socket 6 and a latch release button 7.

In use, a user connects the assembly 1 to a desired sound device, e.g. a mobile telephone, personal stereo device, portable computing device (e.g. a laptop computer or PDA), or the like, via the socket 6. This may be through for example a fixed cable link. The user then extends the cable 4 from the housing 2 to listen to the sound output from the device. Once finished, the user presses the latch release button 7, which allows the cable 4 to be wound up into the housing 2.

Figure 2:
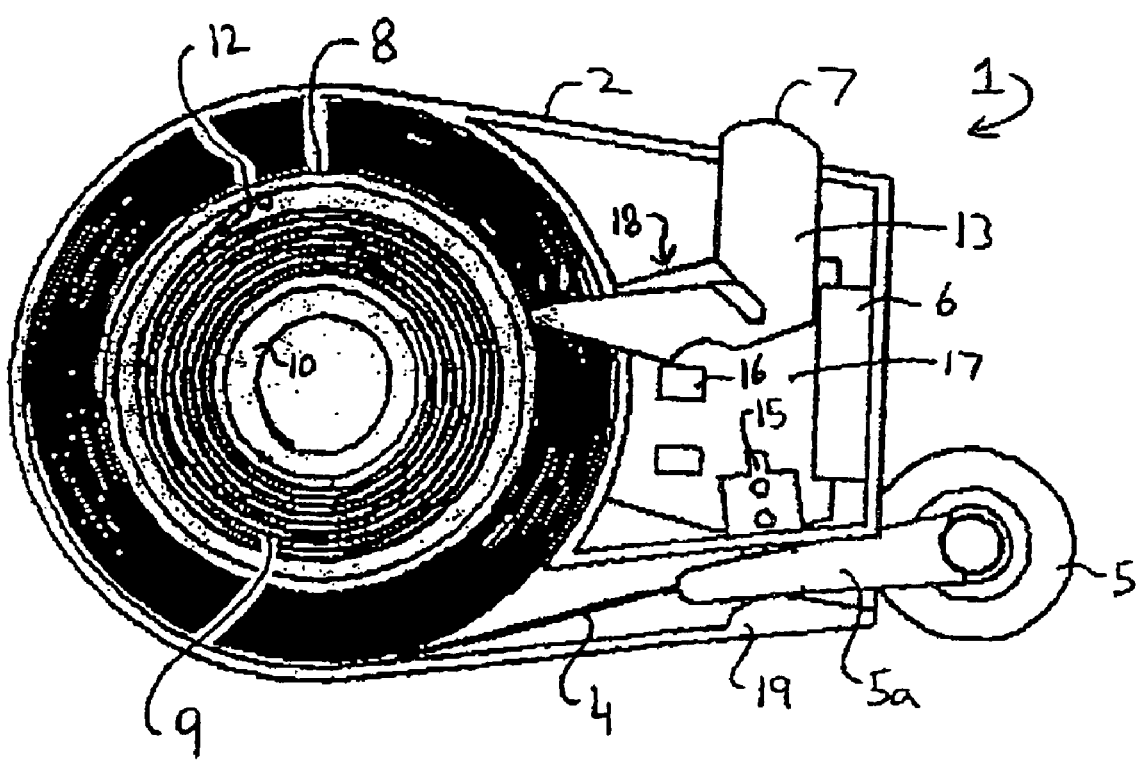
FIG. 2 is a plan view of the device of FIG. 1 with the top cover not shown.

FIG. 2 shows the assembly 1 with the cover 3 not shown for clarity and with the earpiece 5 fully retracted. As can be seen, the cable 4 is wound about a take-up reel 8.

A coiled spring 9 is mounted within the take-up reel 8 about a central stem 10 (shown in FIG. 4) that extends from a cap 11 (shown in FIG. 3) mounted on the assembly cover 3. The spring 9 connects at one end with the stem 10, and at the other end with the take-up reel 8 at a connection point 12 comprising a moulded pin of the reel 8. The coiled spring 9 urges the take-up reel 8 to rotate in a clockwise direction as viewed in FIG. 2, in order to automatically retract the cable 4.

In order to prevent the automatic retraction of the cable 4 during use, a latch element 13 engages with the outer surface of the take-up reel 8, above the cable 4, in such a manner (e.g. through a ratchet mechanism, not shown) so as to prevent clockwise movement of the reel 8, but to allow anti-clockwise movement so that the cable 4 may be easily withdrawn.

The latch element 13 is mounted within a guide channel 14 (see FIG. 4) of be assembly cover 3.

When it is desired to retract the cable 4, a user presses the release button 7, which is part of the latch element 13, so as to disengage the latch element 13 from the take-up reel 8 and allow the real 8 to rotate clockwise under the bias of the spring 9.

A microswitch 15 and other electronic componentry 16 associated with the assembly 1, such as input circuitry, output circuitry, amplification circuitry, volume control circuitry and the like, is mounted on the land portion 17 of a FCB element 18 (discussed further below). The socket 6 is also mounted on the land portion 17.

The microswitch 15 is actuated by a stem portion 5*a* of the earpiece, and provides a signal as to whether the earpiece 5 is within the housing 2 or not.

On retraction of the cable 4, the earpiece stem 5*a* is urged towards the microswitch 15 by a sloping projection 19 on an inner wall of the housing 2.

The signal from the microswitch 15 can be passed through the socket 6 to the device to which the assembly 1 is attached so as to allow the device to take appropriate action, e.g. to switch its sound output form a speaker of the device to the earpiece 5.

Figure 3:
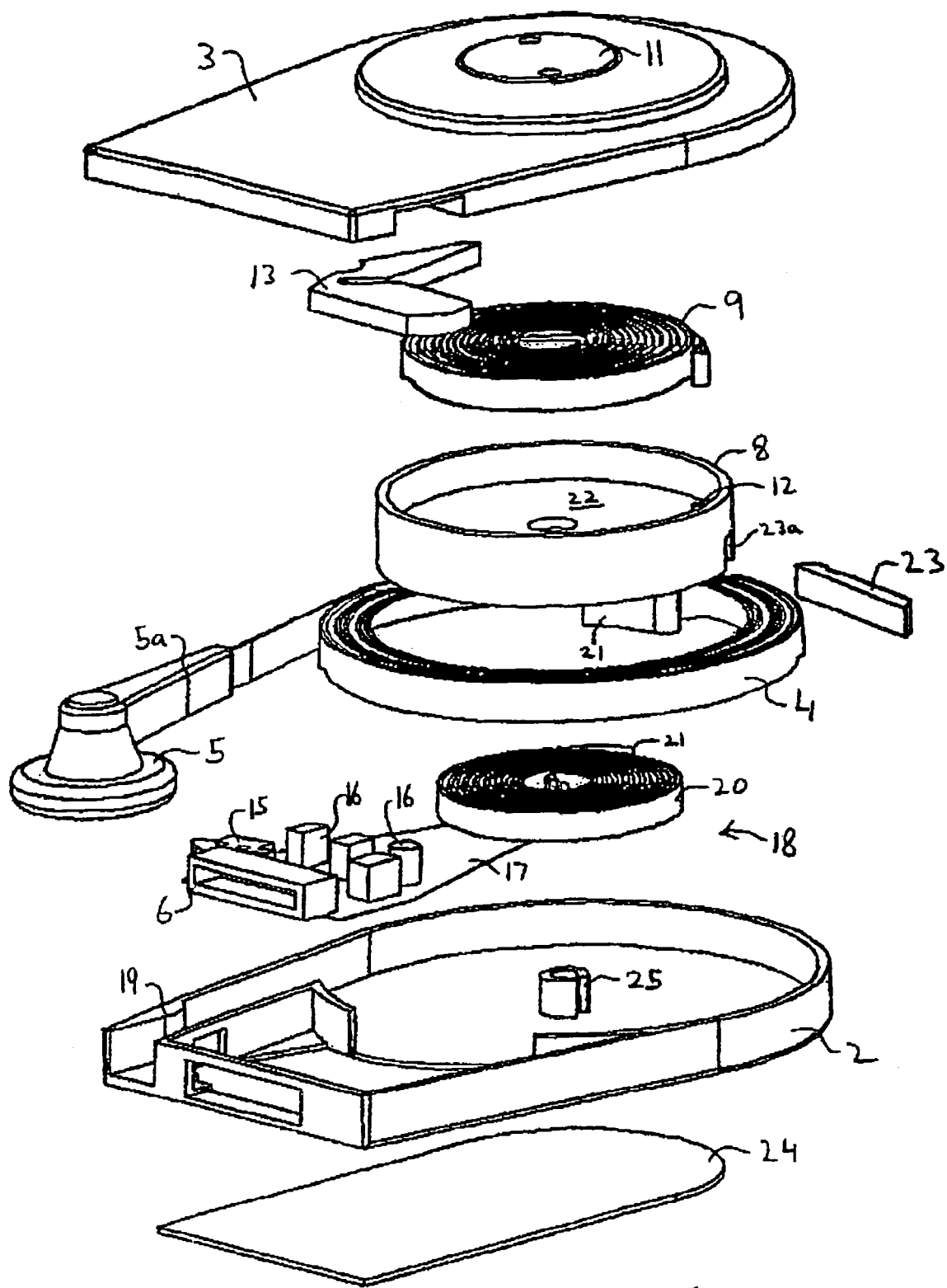
FIG. 3 is an exploded view from above of the device of FIG. 1.
Figure 4:
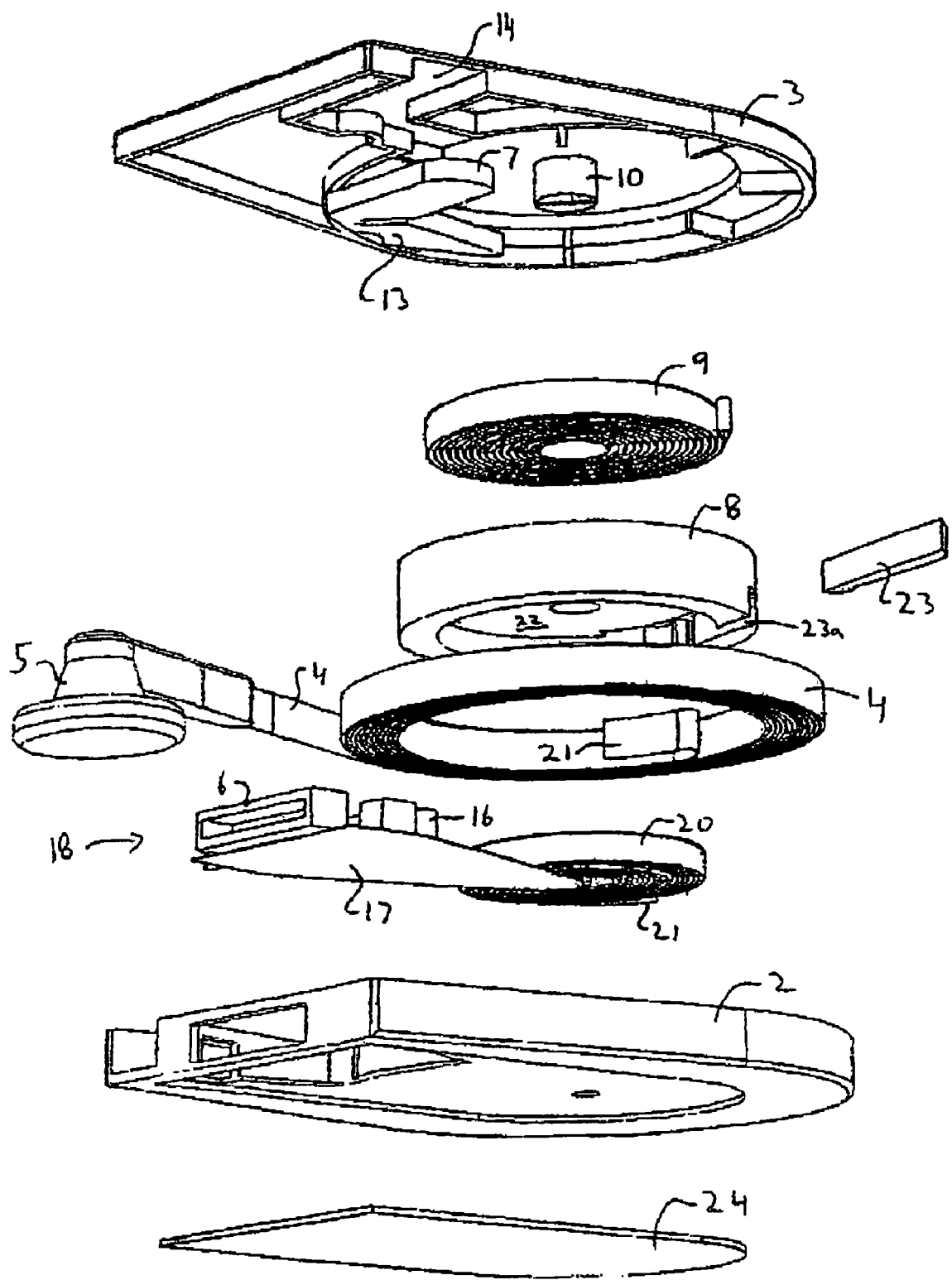
FIG. 4 is an exploded view from below of the device of FIG. 1.

FIGS. 3 and 4 are exploded views of the assembly 1, viewed from above and below respectively. These show more dearly the various features of the assembly 1, and, especially, the FCB element 18.

The FCB element 18 is a one-piece unit that includes the flat land portion 17 and a portion 20 composing a coiled strip that extends from the end of the land portion 17 opposite to the socket 6.

The coiled strip 20 connects to the cable 4 at connection points 21 of the coil 20 and cable 4, and electrical tracks on the strip 20 connect with individual wires within the cable 4, e.g. through soldering, to provide an electrical connection between the earpiece 5 and the assembly socket 6.

The coiled FCB strip 20 is mounted within the take-up reel 8, and is separated from the coiled spring 9 by a wall portion 22.

The cable 4 is clamped against the take-up reel 8 by a clamping element 23 that is inserted into a clamping slot 23*a* in the reel 8. The clamping element 23 prevents strain, caused by pulling the cable 4 out of the assembly 1, from transferring to the connection between the cable 4 and the FCB strip 20, and to the transition area between the FCB strip 20 and the land portion 17. It also holds the cable end of the coiled strip 20 into fixed contact with the reel 8.

A bottom cover 24 is provided over the housing 2, and a stem portion 25 of the housing 2 mounts the coil 20 thereabouts.

When the earpiece 5 is pulled from the assembly 1 for use, the cable 4 is extended, and the take-up reel 8 rotates anti-clockwise (when viewed from the top) as the cable 4 is unwound. As this happens, the coiled strip 20 of FCB (which is coiled clockwise) expands within the take-up reel 8 as the clamped connection point 21 between the strip 20 and cable 4 rotates anti-clockwise with the reel 8.

When the earpiece 5 is no longer required, and the user has pressed the latch release button 7, the take-up reel 8 rotates clockwise under the bias of the coiled spring 9 to wind up the cable 4. As this happens, the coiled strip 20 of FCB contracts within the take-up reel 8, as the clamped connection point 21 between the strip 20 and cable 4 rotates clockwise with the reel 8.

Thus, the use of the coiled strip 20 provides for a fixed connection between the earpiece 5 and the socket 6, which can accommodate the rotation of the cable 4 and its wires without the need for the prior art circular tracks and brushes.

The present invention thus provides a simple, elegant and compact assembly for providing a tractable cable. Furthermore, as the connection between the cable 4 and FCB strip 20 is fixed, good sound quality can be obtained.

The FCB strip may comprise polyamide, or any other suitable material, such as polyimide, polyester or any other well-known FCB material, and may comprise a polyamide substrate, copper conductive elements, and an insulative overlay.

The cable 4 is preferably of a flat configuration, and may comprise plastic insulated copper multichord cable.

The connection between the cable 4 and strip 20 may comprise a solder connection, or electrical tracks and/or plated through-holes mounted on the reel 8, and/or connectors, e.g. subminiature connectors, or the like on the FCB and cable ends which connect to one another and/or with connectors on the reel 8.

Figure 5:
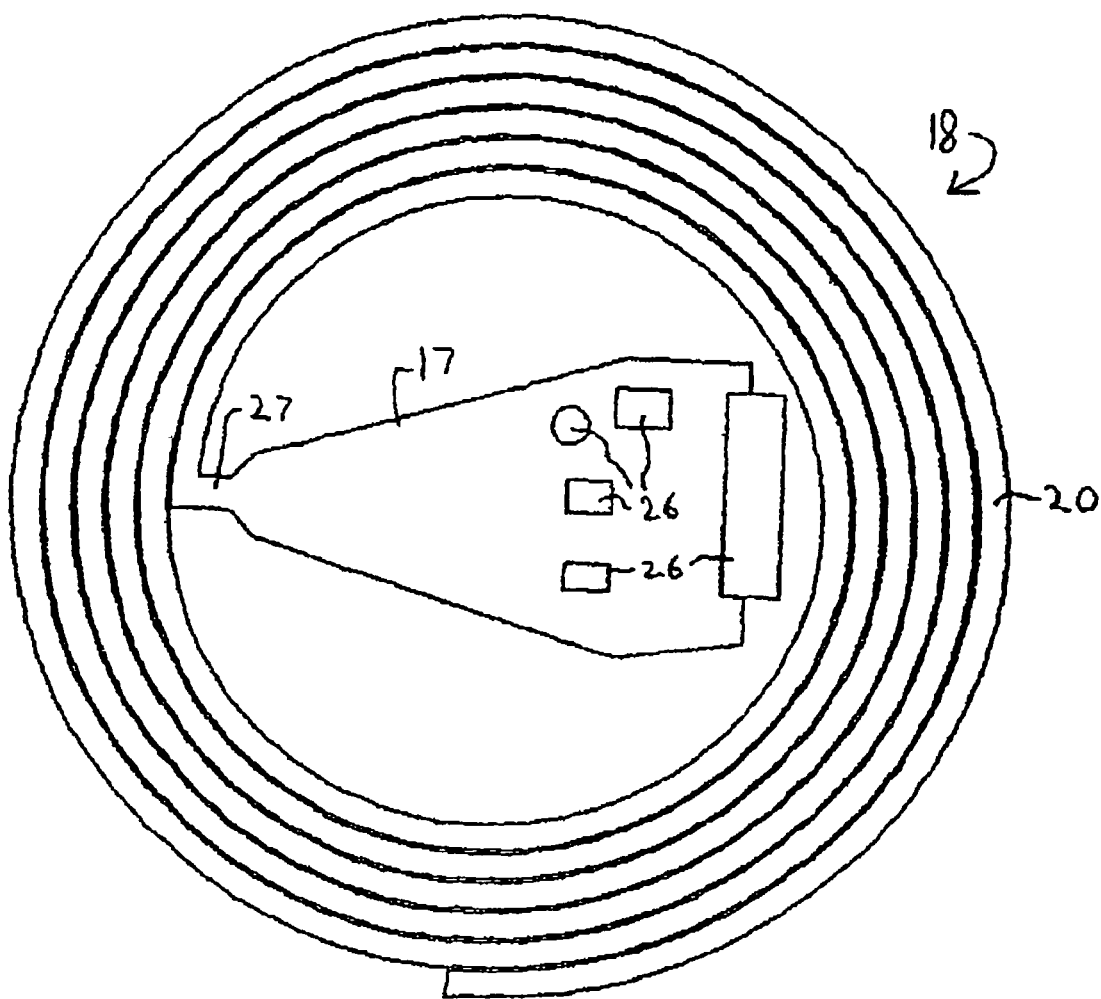
FIG. 5 is a plan view of a FCB sheet cut to provide a FCB element for use in the device of FIG. 1.
Figure 6:
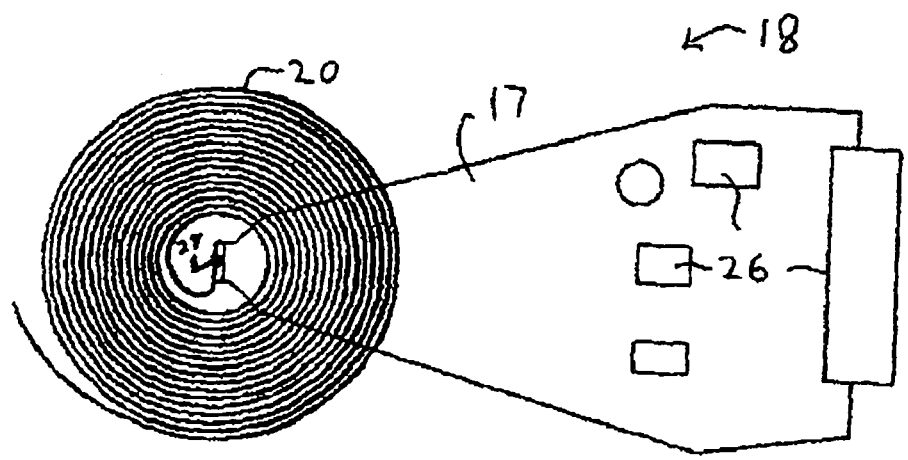
FIG. 6 is a plan view of the FCB element of FIG. 5 with a strip portion thereof wound into a spiral configuration.
Figure 7:
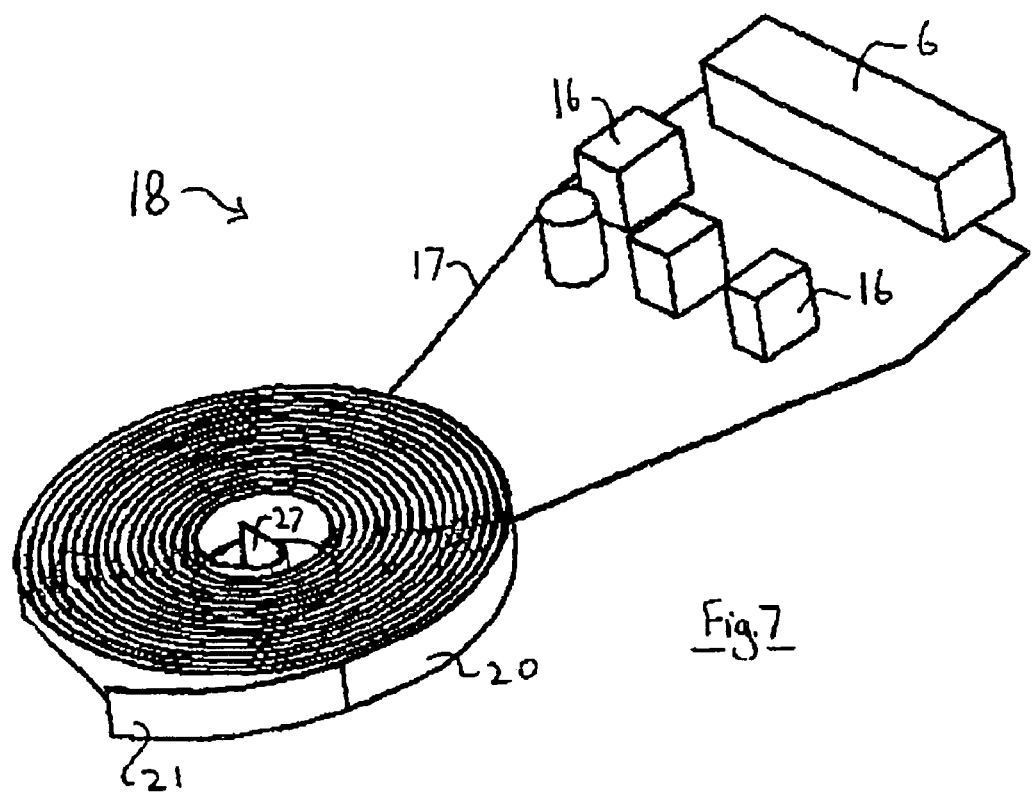
FIG. 7 is a top perspective view of the FCB element of FIG. 6.

FIGS. 5–7 show a FCB element 18 at various stages of manufacture.

Thus, as shown in FIG. 5, the FCB element 18 may be cut from a flat sheet of FCB material that will have been previously laid with suitable electrical tracks to define the tracks of the coiled strip 20 that are to connect with the cable wires, and to define mounting points 26 for the socket 6, microswitch 15 and other componentry 16. Cutting may be by e.g. laser or water jet cutting, routing, die cutting, stamping or machining or any other suitable method.

The spiral strip 20 is initially flat and in the same plane as the land portion 17. It is connected to the land portion 17 by a narrow neck portion 27, and spirals around the land portion 17. This arrangement provides a very efficient and material saving method of producing the FCB element 20.

In one method of construction, once the FCB element 18 has been cut from the sheet of FCB material, the element 18 is bent at the neck 27, and the spiral strip 20 is then fed into the take-up reel 8, which is then rotated about the FCB land portion 17 until all of the FCB strip 20 is housed within the reel 8 in a coiled manner. The termination to the cable 4 is then made, e.g. through a solder connection, and the clamping element 23 is inserted into place.

The FCB element 18 takes the form shown in FIG. 6 with the central axis of the coiled strip 20 perpendicular to the land portion 17.

Alternatively, the strip 20 may be coiled prior to insertion of the FCB element 18 into the reel.

The strip 20 may be coiled by hand or machine, and the neck 27 may be bent by hand or machine.

The socket 6, microswitch 15 and other componentry 16 are connected to the FCB element at the mounting points 26 to provide the resulting FCB element 18 as shown in FIG. 7. They may be provided as a loaded subassy prior to assembly of the element 18 into the cable assembly. The FCB may be received from a FCB manufacturer in the loaded state, so that assembly may then comprise the bending of the neck 27 and insertion of the strip 20 into the reel 8.

Figure 8:
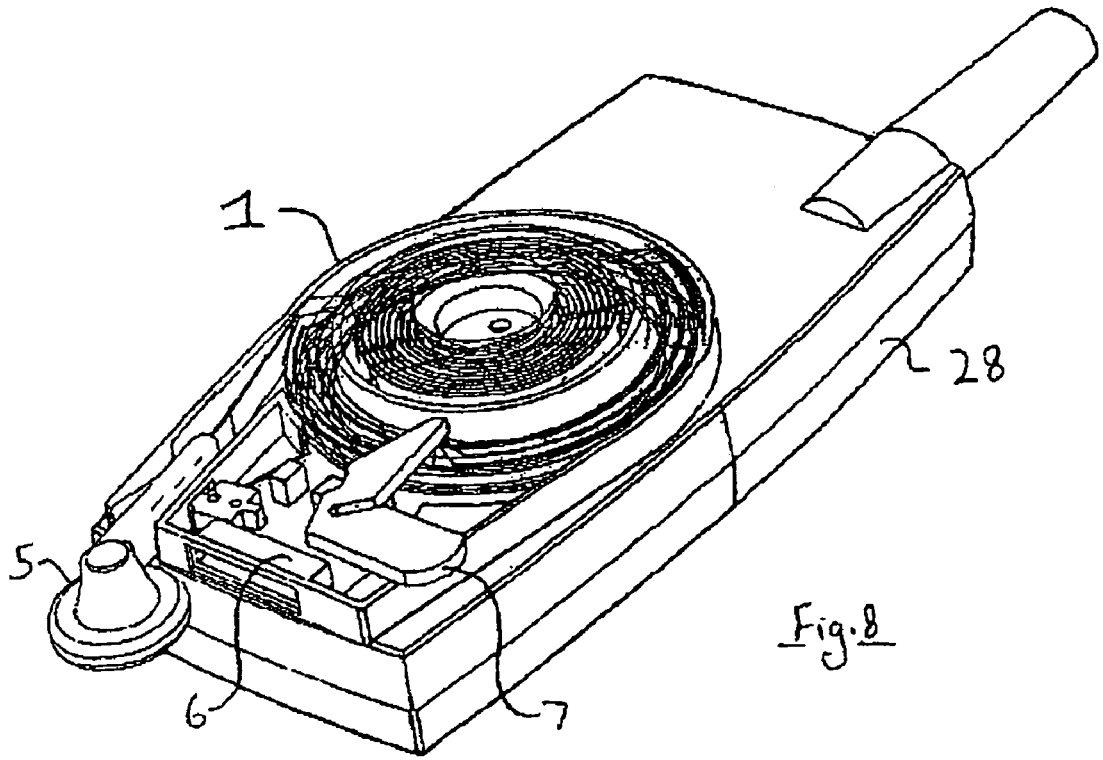
FIG. 8 is a top perspective view of a mobile telephone having the device of FIG. 1 connected thereto, with the device top cover removed.

A typical use of the resulting assembly 1 is shown in FIG. 8, in which the assembly 1 is mounted to the rear of a mobile telephone 28.

A fixed length cable or rigid connector element (not shown) can connect the socket 6 of the assembly to an end connector or the like of the mobile telephone 28, in a similar manner to the connection of known hands-free headsets and the like. The earphone 5 can then be used as desired, the cable 4 being retracted into the assembly 1 when not in use.

The assembly 1 may be physically connected to the telephone 28 in any suitable manner, e.g. by integrated dips, screws, Velcro™ fasteners, adhesive, tape, guides, slides, stitched cover, moulded cover, elastomer moulded cover and/or by any other suitable means.

It is to be understood that various alterations, additions and/or modifications may be made to the parts previously described without departing from the ambit of the present invention.

For example, the assembly 1 need not be limited to use with mobile telephones, and could be used in a wide variety of different situations.

It could be used generally with various sound systems, such as to connect a stereo with extensible speakers, and could especially be used in the field of personal sound systems, such as personal CD players, MP3 players, minidiscs, tape recorders, radios, dictaphones, or the like.

It could also be used with laptop computers, personal digital assistants (PDAs), games consoles and the like.

Also, the assembly 1 need not be limited to use with an earpiece 5, and this could be replaced with any suitable element or device that is to extend from a base unit or other structure. It could for example comprise a pair of earphones, a microphone, or a headset comprising earphones and a microphone. It could also have no relation to sound reproduction, and could provide a retractable cable for e.g. a PC connection, a game controller, e.g. a paddle or joystick, and/or a power connection.

The cable 4 need not be flat and could comprise any suitable wiring arrangement.

The coiled strip 20 need not be a FCB strip, and could take any form of connection that may be coiled. It could also provide the spring bias to the reel 18.

Instead of being a separate unit, the retractable assembly could be an integral part of a device, e.g. integrally provided within the mobile telephone 28, e.g. at the time of manufacture of the telephone.

Further, the earpiece, microphone or other component to be extended could be mounted on or at the assembly, and the tree end of the cable could have an electrical connection which e.g. provides the socket 6 features or could comprise a jack plug or any other desired connection.

The cable 4 may have no end component at all, e.g. If the cable itself were to be used as an antenna.

As an alternative to a spring-biased reel, the assembly could include a mechanism for manually winding the reel.

In further embodiments, the reel may be motorised and/or may be automatically activated. It may thus be turned by a motor, e.g. an electric motor. In one embodiment the motor may be activated by a user pressing a retraction switch of the assembly or associated device. Alternatively or also, the motor could be voice activated, e.g. using a microphone in the assembly itself, or using a microphone of an associated device, e.g. mobile phone or the like. For example, where the assembly is mounted on or built within a mobile telephone, a voice command into the microphone of the mobile phone may be used to activate a motor to retract the cable. Further, a signal indicating any suitable associated device action or status may be used to activate the cable retraction, such an action could be e.g. the powering down of the device, or the switching to a stand-by mode or to a mode in which the cable is not required. It could also include the switching of a switch of the device, including e.g. the clicking of a retract icon on the screen of a computing device where the invention is used with a computing device or the pressing of a mobile phone dial button, e.g. after ending a phone call.

The invention claimed is:

1. A retractable cable assembly, in which a cable is connected to associated circuitry through a flexible circuit board element that comprises a base portion on which the circuitry is mounted and an elongate coiled strip that connects with the cable, the base portion being substantially wider than the coiled strip, said base portion and said strip being formed from a single substrate on which are provided electrical tracks for connecting the circuitry with the cable.

2. A cable management assembly including a flexible circuit board element that connects an extendible cable with associated electronic componentry, wherein said flexible circuit board element includes a base portion on which said electronic componentry is mounted, and an elongate coiled strip with which said extendible cable connects, the base portion being substantially wider than the coiled strip, said base portion and said coiled strip being integrally formed from a single substrate on which is provided a plurality of conductive tracks for connecting said electronic componentry with said cable.

3. A cable management assembly including a retractable cable mounted on a take-up reel, and a coiled flexible circuit board element mounted within the take-up reel and electrically connected to the retractable cable so as to allow the cable to connect with associated electronic circuitry whilst also accommodating movement of the reel end of the cable when the cable is retracted or extended, said coiled flexible circuit board element including a coiled strip portion and a flat base portion formed integrally therewith from a single substrate, the base portion being substantially wider than the coiled strip, said associated electronic circuitry being provided on said base portion, and said base portion extending transversely to an axis of rotation of said take-up reel and said coiled strip portion.

4. A cable management assembly including a retractable cable and a unitary flexible circuit board element, the flexible circuit board element having a coiled portion formed of an elongate strip, and a land portion, with the coiled portion coiling about an axis inclined to the plane of the land portion, the land portion being substantially wider than a width of the elongate strip, the coiled portion and the land portion having one or more electrical tracks extending across the land portion and the coiled portion, and the land portion having one or more electronic components thereon, the cable connecting with the tracks of the coiled portion.

5. A cable management system, comprising:
a retractable cable including one or more wires therein;
a take-up reel lying in a plane and having an axis of rotation perpendicular thereto, the cable being wound around the reel; and
a flexible circuit board element comprising a base portion and elongate coiled strip formed from a single substrate, said base portion being substantially wider than said elongate coiled strip wherein said elongate coiled strip is mounted within said reel and has one or more conductive tracks provided thereon that connect with said one or more wires of said retractable cable, and said base portion extends in the plane of the reel outwardly past the periphery of the reel to form a surface for mounting componentry, and wherein a microswitch is mounted on said surface adjacent said cable to determine whether said cable is in retracted or extended condition.

6. A method of making a retractable cable assembly, the assembly including a flexible circuit board element for connecting a cable to associated circuitry, the flexible circuit board element having a base portion and an integral elongate strip form in a coil, the base portion being substantially wider than a width of the elongate strip wherein the method includes the step of forming said base portion and the coil portion from a single substrate, connecting said associated circuitry to said base portion, and connecting said elongate coil to said cable.

7. The method of claim 6, including the step of cutting said base portion and said spiral coil portion from a flat substrate on which are laid electrical tracks, the coil portion being formed as a spiral strip about the base portion and connecting thereto via a neck portion, and including the steps of bending the neck portion out of the plane of the base portion, and winding the spiral strip into a coil about an axis defined by the bent neck portion.

8. A retractable cable assembly for connection with an electronic device, the assembly including:
a retractable cable including one or more wires therein;
a take-up reel having an axis of rotation, the cable being wound about said reel; and
a flexible circuit board element, the flexible circuit board element comprising a base portion and an elongate coiled strip formed from a single flexible circuit board substrate, the base portion being substantially wider than the coiled strip;
wherein said base portion has electrical circuitry mounted thereon, including connection circuitry for connecting with the electronic device,
said elongate coiled strip has electrical connection tracks provided thereon, said tracks at a first end connecting with said circuitry on said base portion and at a second end connecting with one or more of said wires of said retractable cable, and
said coiled strip is housed within said reel, with said base portion extending transversely to said axis of rotation of said reel.

9. The assembly of claim 8, wherein the flexible circuit board element has a flexible substrate, conductive elements thereon, and an insulative cover layer.

10. The assembly of claim 8, wherein the flexible substrate is made from one or more of polyamide, polymide and polyester.

11. The assembly of claim 8, wherein the flexible circuit board element is single-sided, double-sided or multilayered.

12. The assembly of claim 8, wherein the cable is of a flat configuration.

13. The assembly of claim 8, wherein the flexible circuit board element is wound in an opposite direction to the winding of the cable.

14. The assembly of claim 8, wherein the take-up reel includes connection elements for connecting wires from the cable with tracks of the flexible circuit board element.

15. The assembly of claim 8, wherein the retractable cable is anchored towards its reel end.

16. The assembly of claim 8, wherein the retractable cable is clamped to the reel.

17. The assembly of claim 15, wherein anchoring occurs at a connection between the cable and flexible circuit board element.

18. The assembly of claim 8, wherein the reel is spring-biased to retract the cable.

19. The assembly of claim 18, wherein the assembly includes a coiled spring to provide the spring-bias.

20. The assembly of claim 8, including a latch mechanism to prevent retraction of the cable until the latch mechanism is released.

21. The assembly of claim 8, including a sensor for indicating that the cable is extended and/or retracted.

22. The assembly of claim 8, wherein the assembly is adapted to be integral with said device.

23. The assembly of claim 22, wherein the flexible circuit board element is adapted to provide a connection between the cable and input and/or output circuitry of the device.

24. The assembly of claim 8, wherein the assembly is configured as a stand-alone unit.

25. The assembly of claim 24, wherein the flexible circuit board element provides a connection between the cable and connection componentry for connecting the cable to an input and/or output connection of another device.

26. The assembly of claim 8, wherein the assembly includes a transducer component at the free end of the retractable cable.

27. An assembly according to claim 8, wherein a free end of the cable includes thereon one or more of an earphone, an microphone, a headset, a loudspeaker, and/or a games controller.

28. The assembly of claim 8, wherein the assembly includes a connection element at the free end of the retractable cable.

29. The assembly of claim 8, including two or more retractable cables.

30. A device including a retractable cable assembly according to claim 8.

31. The device of claim 30, wherein the device comprises one of a mobile phone, a portable computing device, or a personal sound device.

32. A personal electronic device including an assembly in accordance with claim 8.

33. The retractable cable assembly of claim 8, wherein a microswitch is mounted on said base portion for detecting retraction of said cable.

* * * * *